United States Patent
Kosaka et al.

(10) Patent No.: US 12,050,396 B2
(45) Date of Patent: Jul. 30, 2024

(54) REFLECTIVE MASK BLANK, METHOD OF MANUFACTURING THEREOF, AND REFLECTIVE MASK

(71) Applicant: Shin-Etsu Chemical Co., Ltd., Tokyo (JP)

(72) Inventors: Takuro Kosaka, Joetsu (JP); Shohei Mimura, Joetsu (JP); Takuro Yamamoto, Joetsu (JP); Yukio Inazuki, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 373 days.

(21) Appl. No.: 17/207,928

(22) Filed: Mar. 22, 2021

(65) Prior Publication Data

US 2021/0318607 A1    Oct. 14, 2021

(30) Foreign Application Priority Data

Apr. 10, 2020  (JP) .................................. 2020-070677

(51) Int. Cl.
  *G03F 1/24*  (2012.01)
(52) U.S. Cl.
  CPC ...................... *G03F 1/24* (2013.01)
(58) Field of Classification Search
  CPC ....................................................... G03F 1/24
  See application file for complete search history.

(56) References Cited

U.S. PATENT DOCUMENTS

| | | |
|---|---|---|
| 2007/0238033 A1 | 10/2007 | Kanayama et al. |
| 2010/0304283 A1 | 12/2010 | Hayashi et al. |
| 2011/0070534 A1 | 3/2011 | Hayashi |
| 2012/0322000 A1* | 12/2012 | Uno ................... C23C 14/0036 430/5 |
| 2014/0017601 A1* | 1/2014 | Mikami ................... G03F 1/24 430/5 |

(Continued)

FOREIGN PATENT DOCUMENTS

| | | |
|---|---|---|
| JP | 2002-246299 A | 8/2002 |
| WO | WO 2006/062099 A1 | 6/2006 |
| WO | WO 2011/108470 A1 | 9/2011 |

OTHER PUBLICATIONS

Extended European Search Report for European Corresponding Application No. 21187713.3, daled Sep. 13, 2021.

*Primary Examiner* — Peter L Vajda
*Assistant Examiner* — Jayson D Cosgrove
(74) *Attorney, Agent, or Firm* — Birch, Stewart, Kolasch & Birch, LLP

(57) ABSTRACT

A reflective mask blank that is a material for a reflective mask used in EUV lithography using EUV light as the exposure light, including a substrate, a multilayer reflection film that is formed on one main surface of the substrate and reflects the exposure light, and an absorber film that is formed on the multilayer reflection film and absorbs the exposure light, the absorber film being a single layer consisting of a first layer, or a plurality of layers consisting of, from the substrate side, a first layer and a second layer, the first layer being composed of tantalum and nitrogen and containing 55 to 70 at % of tantalum and 30 to 45 at % of nitrogen, the second layer being composed of tantalum and nitrogen, and oxygen of not more than 40 at %.

10 Claims, 4 Drawing Sheets

(56) References Cited

U.S. PATENT DOCUMENTS

| | | | |
|---|---|---|---|
| 2014/0186752 A1* | 7/2014 | Kinoshita | G03F 1/48 430/5 |
| 2016/0161837 A1* | 6/2016 | Hamamoto | G03F 1/24 430/311 |
| 2019/0227427 A1* | 7/2019 | Abdo | G03F 1/58 |

* cited by examiner

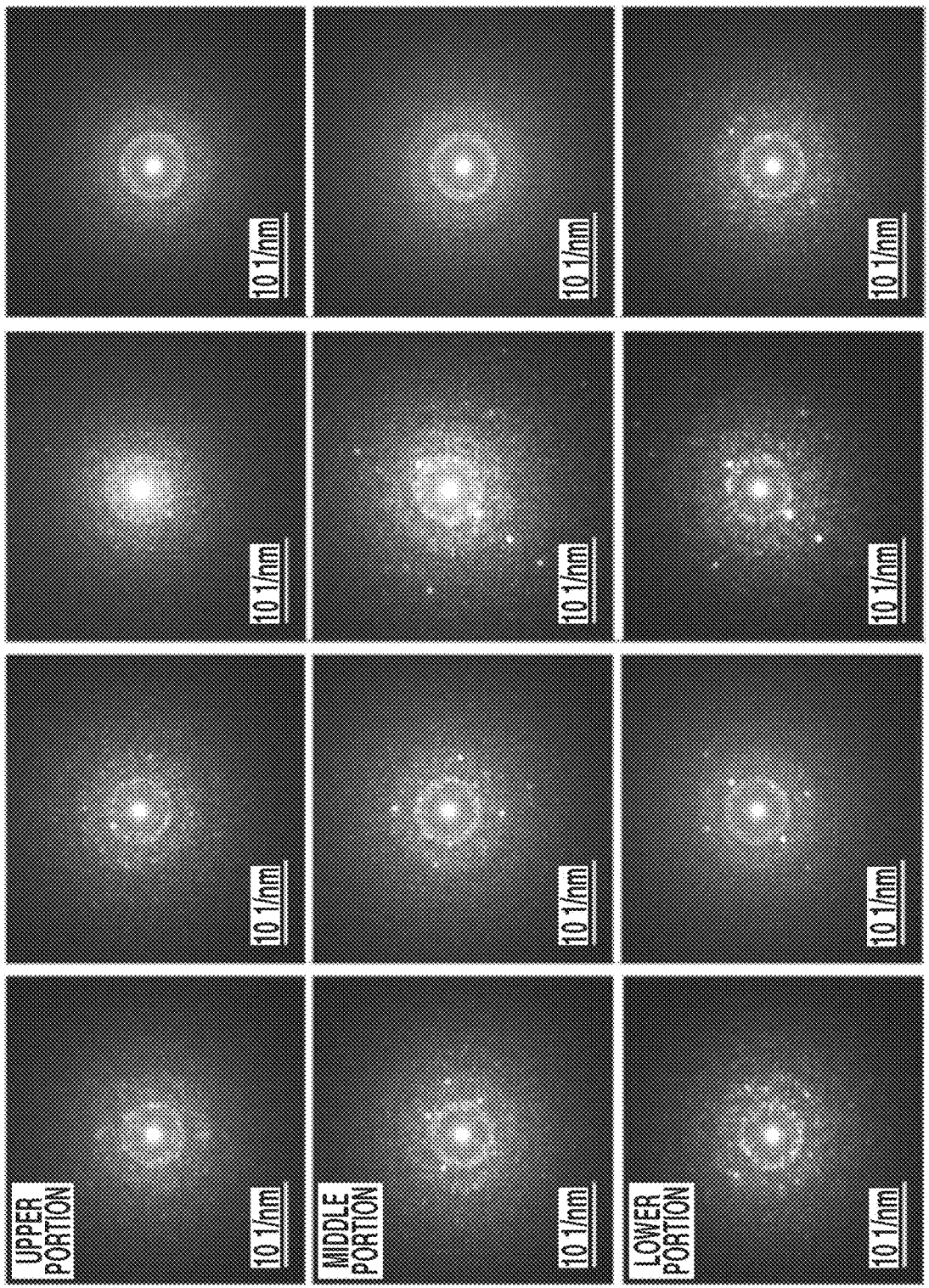

REFLECTIVE MASK BLANK, METHOD OF MANUFACTURING THEREOF, AND REFLECTIVE MASK

CROSS-REFERENCE TO RELATED APPLICATION

This non-provisional application claims priority under 35 U.S.C. § 119(a) on Patent Application No. 2020-70677 filed in Japan on Apr. 10, 2020, the entire contents of which are hereby incorporated by reference.

TECHNICAL FIELD

The present invention relates to a reflective mask blank which is a material for a reflective mask used for manufacturing semiconductor devices such as LSIs, a method of manufacturing thereof, and a reflective mask.

BACKGROUND ART

In a manufacturing process of a semiconductor device, a photolithography technique in which a circuit pattern formed on a transfer mask is transferred onto a semiconductor substrate (semiconductor wafer) through a reduction projection optical system with irradiating exposure light to the transfer mask is used. At present, a mainstream wavelength of the exposure light is 193 nm by argon fluoride (ArF) excimer laser light.

However, since it is necessary to form a further fine pattern, EUV lithography technique using, as exposure light, extreme ultraviolet (hereinafter referred to "EUV") light having a wavelength shorter than the ArF excimer laser light is promising. EUV light is light having a wavelength of about 0.2 to 100 nm, more specifically, light having a wavelength of about 13.5 nm. This EUV light has a very low transparency to a substance and cannot be utilized for a conventional transmissive projection optical system or a mask, thus, a reflection type optical elemental device is applied. Therefore, a reflective mask is also proposed as a mask for the pattern transfer. The reflective mask has a multilayer reflection film that is formed on a substrate and reflects EUV light, and a patterned absorber film that is formed on the multilayer reflection film and absorbs EUV light, and such a mask is used as a common reflective mask. A pattern is formed on an object for transferring the pattern such as a silicon wafer by utilizing a difference of reflectance of EUV light as an exposure light, caused by presence and absence of the absorber film on the multilayer reflection film.

A reflective mask is manufactured from a reflective mask blank. The reflective mask blank includes a multilayer reflection film that is formed on a substrate and reflects exposure light, and an absorber film that is formed on thereon and has a low reflectance with respect to the exposure light, and further commonly includes a protection film between the multilayer reflection film and the absorber film. The multilayer reflection film is formed by laminating alternately layers having different refraction indexes. For example, a multilayer reflection film in which molybdenum (Mo) layers and silicon (Si) layers are alternately laminated is used for EUV light exposure, and an absorber film which contains tantalum (Ta) with adding nitrogen (N) is used for EUV light exposure (Patent Document 1: JP-A 2002-246299).

CITATION LIST

Patent Document 1: JP-A 2002-246299

SUMMARY OF THE INVENTION

In order to transfer a fine pattern to a semiconductor substrate or the like with high accuracy using a reflective mask, since an absorber film is partially removed to form a pattern, it is necessary to reduce change in the surface shape (for example, warpage) of the substrate caused by release of film stress, after the pattern of the absorber film has been formed. For the purpose, it is necessary to reduce an amount of deformation of the substrate caused by the film stress of the absorber film which is formed on the substrate and has not formed pattern. Further, when the pattern of the absorber film is formed by dry etching, the absorber film preferably has a high etching rate. When the etching rate is low, a thick resist film must be formed to form the pattern, and even if a hard mask film is used, the hard mask film may also be etched when the absorber film is etched. Thus, a high etching rate is preferable to form a highly accurate pattern. When an etching amount of an etching mask such as a resist film becomes large, a cross-sectional shape tends to deteriorate. Therefore, it is important to have a high etching rate for the absorber film to form a pattern with a good cross-sectional shape. Furthermore, a surface roughness of the absorber film is needed to be flat because not only defect detection sensitivity deteriorates when the surface roughness is large, but also oxygen is easy to diffuse to the film having a large surface roughness thereby the etching rate may be decreased.

The present invention has been made to solve the above problems, and an object of the present invention is to provide a reflective mask blank having pattern resolution-ability improved by an absorbent film having excellent processability, a method of manufacturing thereof, and a reflective mask manufactured by using the reflective mask blank.

The inventors have been found that, in a reflective mask blank for EUV light, an absorber film consisting of a single layer consisting of a first layer composed of tantalum and nitrogen, or a plurality of layers consisting of, from the substrate side, a first layer composed of tantalum and nitrogen, and a second layer composed of tantalum and nitrogen, and oxygen of not more than 40 at %, particularly the absorber film including the first layer containing 55 to 70 at % of tantalum and 30 to 45 at % of nitrogen, has a reduced film stress and a high etching rate.

In one aspect, the invention provides a reflective mask blank that is a material for a reflective mask used in EUV lithography using EUV light as the exposure light, including a substrate, a multilayer reflection film that is formed on one main surface of the substrate and reflects the exposure light, and an absorber film that is formed on the multilayer reflection film and absorbs the exposure light, wherein
the absorber film is a single layer consisting of a first layer, or a plurality of layers consisting of, from the substrate side, a first layer and a second layer,
the first layer is composed of tantalum and nitrogen,
the second layer is composed of tantalum and nitrogen, and oxygen of not more than 40 at %, and
the first layer contains 55 to 70 at % of tantalum and 30 to 45 at % of nitrogen.

Preferably, the absorber film has an amorphous or crystal structure at the middle portion in a thickness direction, and a crystallinity at the substrate side is higher than that at the middle portion and/or a crystallinity at the side remote from the substrate is higher than that at the middle portion.

Preferably, the absorber film has a surface roughness RMS of not more than 0.6 nm.

Preferably, the absorber film is free of β-Ta crystal phase, α-Ta crystal phase and cubical TaN crystal phase.

Preferably, the reflective mask includes a protection film wherein the protection film is intervened between the multilayer reflection film and the absorber film, is contact with the multilayer reflection film, and has different etching property from the absorber film.

Preferably, the reflective mask includes a conductive film formed on another main surface of the substrate.

Preferably, the one main surface has a size of 152 mm-square, and a variation ΔTIR of warpages TIRs within the central area of the surface of 142 mm-square before and after forming the absorber film is not more than 0.4 μm as an absolute value.

In another aspect, the invention provides a method of manufacturing a reflective mask blank, including a step of forming the absorber film by a reactive sputtering in which magnetron sputtering using a Ta target and a sputtering gas is applied, the sputtering gas being a rare gas, and nitrogen gas $N_2$ as a reactive gas.

In further aspect, the invention provides a reflective mask manufactured from the reflective mask blank.

Advantageous Effects of the Invention

According to the inventive reflective mask blank, change in the surface shape (for example, warpage) of a substrate caused by release of film stress can be reduced, after a pattern of an absorber film is formed, and the absorber film is ensured a required level or more of an etching rate for dry etching.

BRIEF DESCRIPTION OF THE DRAWINGS

FIGS. 4A to 4D are electron diffraction images in cross-section of TaN-series films obtained in Experimental Examples 1 to 4, respectively, upper, middle and lower images in each column being observed at upper, middle and lower portions of the film, respectively.

DESCRIPTION OF THE PREFERRED EMBODIMENT

Figure 1:
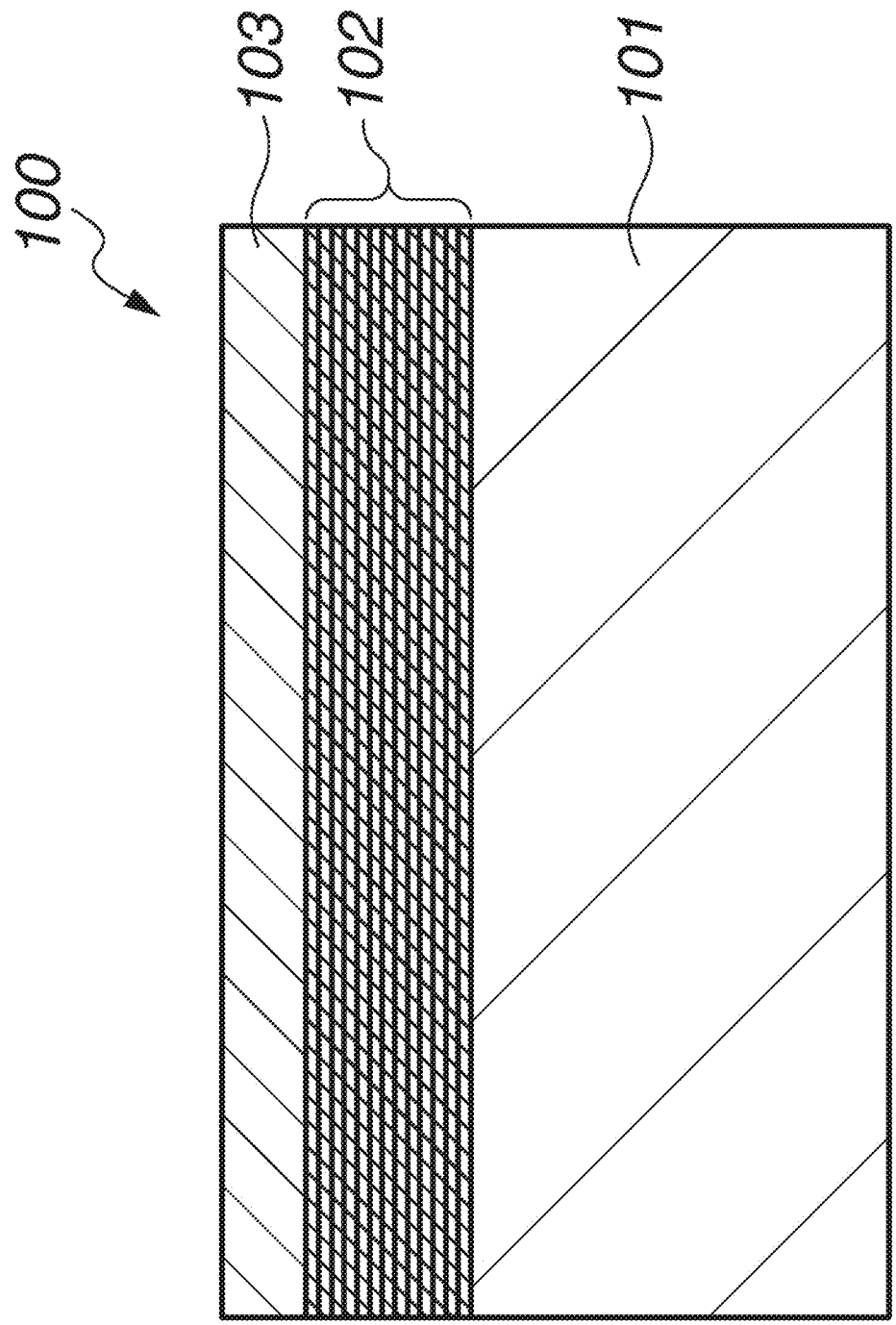
FIG. 1 is a cross-sectional view illustrating an example of a reflective mask blank.

A reflective mask blank of the invention includes a substrate, a multilayer reflection film that is formed on a substrate, particularly, on one main surface (front side surface) of the substrate and reflects exposure light, specifically, a multilayer reflection film for reflection of exposure light such as extreme ultraviolet (EUV) light, and an absorber film that is formed on the multilayer reflection film and absorbs the exposure light, specifically, an absorber film for absorption of exposure light such as EUV light and reduction of reflectance. A reflective mask such as an EUV reflective mask including an absorber pattern (a patter of the absorber film) formed by patterning the absorber film is manufactured from the reflective mask blank utilizing EUV light as exposure light such as an EUV reflective mask blank. The EUV light for EUV lithography using EUV light as exposure light has a wavelength of 13 to 14 nm, typically about 13.5 nm.

The multilayer reflection film is preferably disposed contiguously on one main surface of the substrate. However, an underlayer film may be provided between the substrate and the multilayer reflection film as long as effects of the invention are not impaired. The absorber film may be disposed contiguously on the multilayer reflection film. However, a protection film (a protection film for the multilayer reflection film) having different etching property from the absorber film may be provided between the multilayer reflection film and the absorber film. The protection film is disposed preferably in contact with the multilayer reflection film, more preferably in contact with both of the multilayer reflection film and the absorber film. The protection film is used to protect the multilayer reflection film in processing step such as cleaning and correction. Further, the protection film preferably has a function of protecting the multilayer reflection film when the absorber film is patterned by etching or a function of preventing oxidation of the multilayer reflection film. Furthermore, a hard mask film (an etching mask film for the absorber film) having different etching property from the absorber film may be provided on the side remote from the substrate of the absorber film, preferably, disposed in contact with the absorber film. On the other hand, a conductive film may be formed on another main surface (back side surface) of the substrate which is the opposite side to the one main surface, preferably in contact with the substrate. The conductive film is used for holding a reflective mask on an exposure tool by an electrostatic chuck. In the above description, one main surface of the substrate is defined as the front side or the upper side, and another main surface is defined as the back side or the lower side. However, the front and back sides or the upper and lower sides in both surfaces are defined for the sake of convenience. Two main surfaces (film forming surfaces) are one and another main surfaces, respectively. The front and back sides or the upper and lower sides may be substituted.

Figure 2:
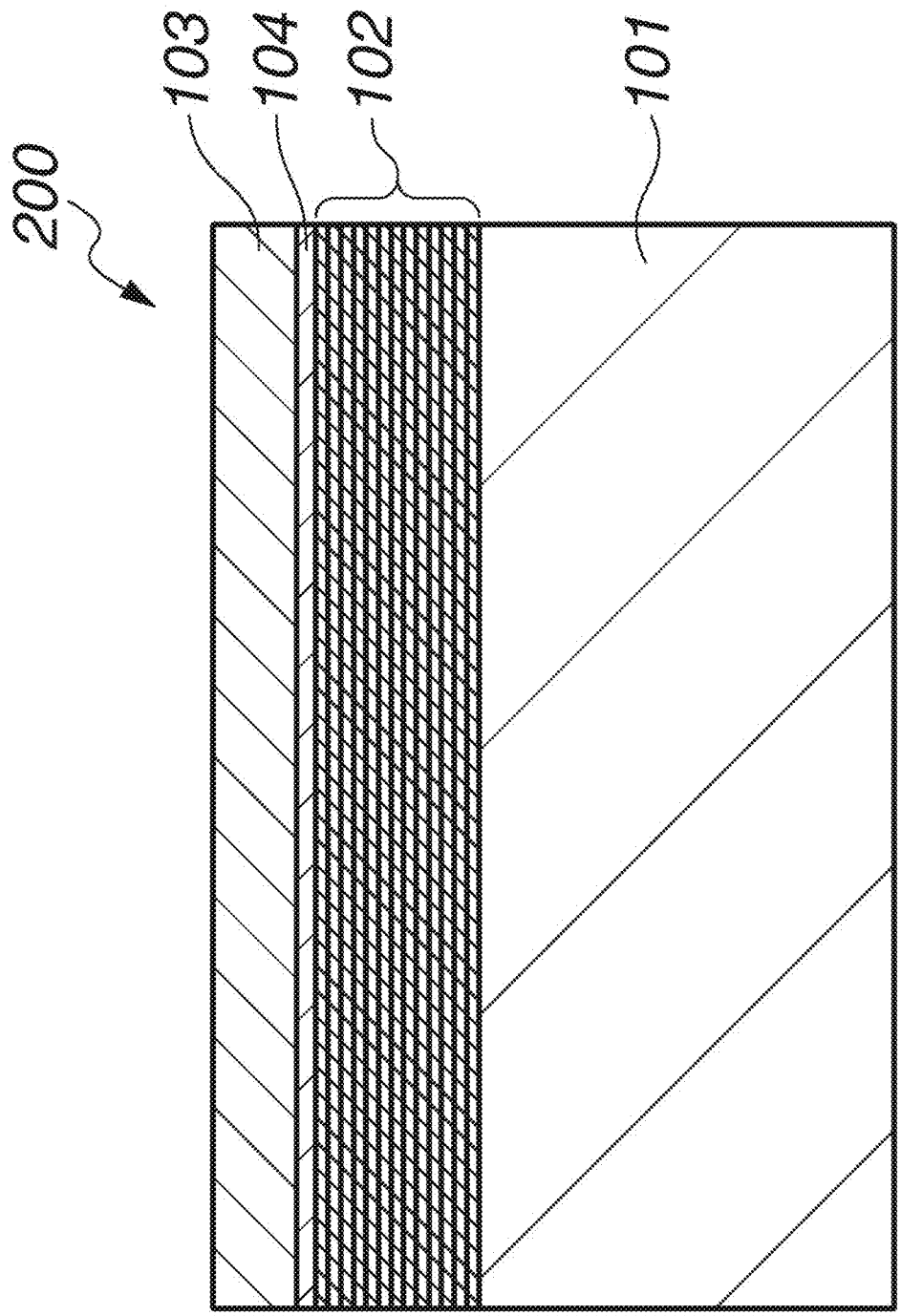
FIG. 2 is a cross-sectional view illustrating another example of a reflective mask blank.
Figure 3:
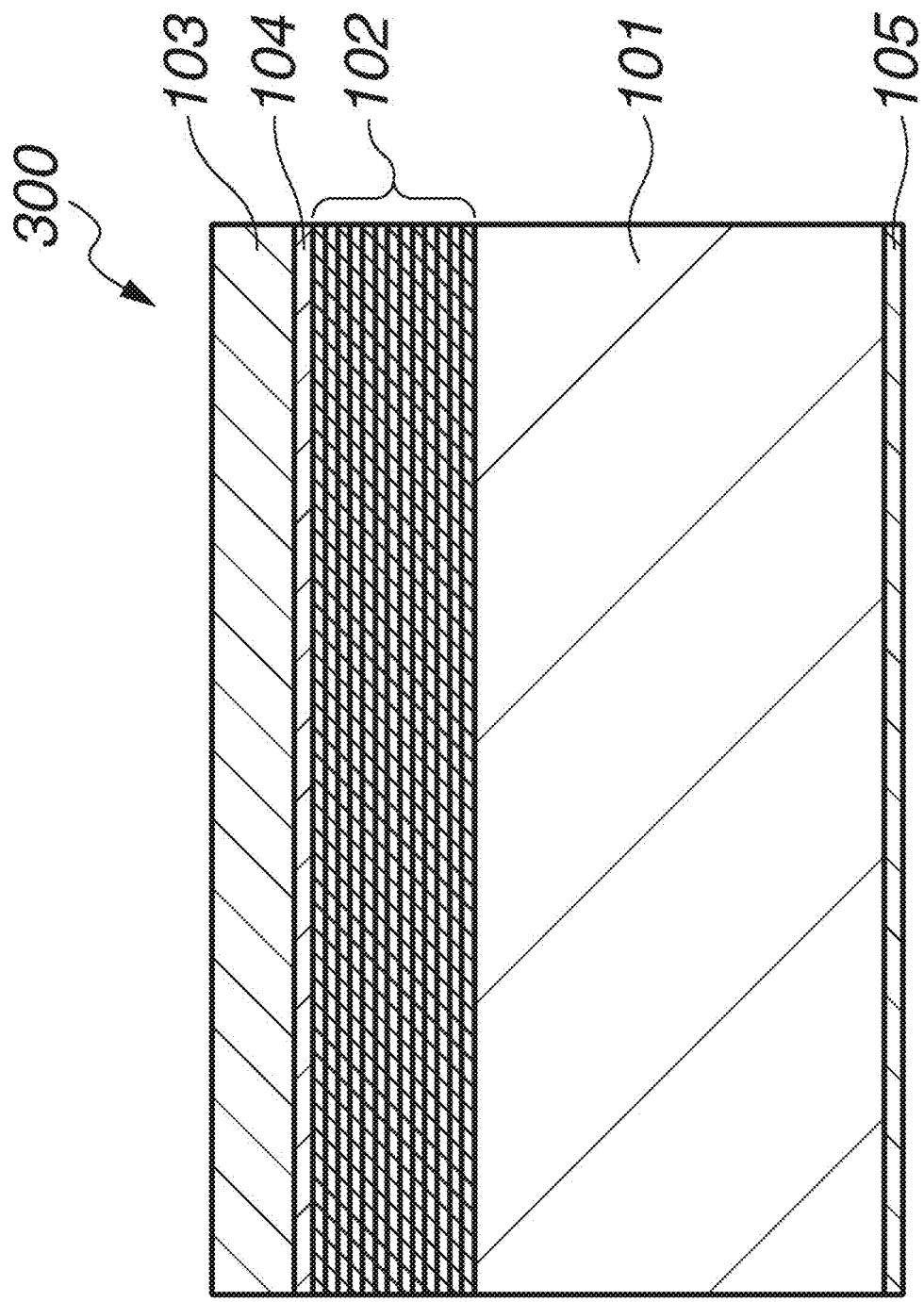
FIG. 3 is a cross-sectional view illustrating the other example of a reflective mask blank.

Typical examples of reflective mask blanks of the invention are shown in FIGS. 1 to 3. FIG. 1 is a cross-sectional view illustrating an example of a reflective mask blank. The reflective mask blank 100 includes a multilayer reflection film 102 disposed contiguously on one main surface of a substrate 101, and an absorber film 103 disposed contiguously on the multilayer reflection film 102. FIG. 2 is a cross-sectional view illustrating another example of a reflective mask blank. The reflective mask blank 200 includes a multilayer reflection film 102 disposed contiguously on one main surface of a substrate 101, a protection film 104 disposed contiguously on the multilayer reflection film 102, and an absorber film 103 disposed contiguously on the protection film 104. FIG. 3 is a cross-sectional view illustrating the other example of a reflective mask blank. The reflective mask blank 300 includes a multilayer reflection film 102 disposed contiguously on one main surface of a substrate 101, a protection film 104 disposed contiguously on the multilayer reflection film 102, an absorber film 103 disposed contiguously on the protection film 104, and a conductive film 105 disposed contiguously on another main surface of a substrate 101.

For example, a 6025 substrate which has a size of 6 inch×6 inch×0.25 inch-thick may be used as the substrate of the invention. In a case where the SI unit system is used, the 6025 substrate is generally represented as a substrate having a size of 152 mm×152 mm×6.35 mm-thick. The substrate is to be reduced distortion of the pattern due to thermal expansion during exposure, thus, coefficient of thermal expansion of the substrate is preferably not more than 30 ppb/° C., more preferably not more than 10 ppb/° C., as an absolute value. Examples of a material for the substrate include titania-doped quartz glass ($SiO_2$—$TiO_2$-based glass) and other materials.

A flat substrate is preferable in viewpoint to obtain high position accuracy in detecting defects in the multilayer reflection film, forming an absorber pattern, or detecting defects in the absorber film. On the main surface which is the side of forming the multilayer reflection film, a flatness is preferably not more than 0.1 µm, more preferably not more than 0.05 µm, in an exposure pattern forming area. The exposure pattern forming area is, for example, in case of a 6025 substrate, the central area of the main surface, for example, a range of 132 mm×132 mm. In order to obtain high reflectance on the main surface which is the side of forming the multilayer reflection film, the surface roughness is preferably smaller. Thus, the surface roughness RMS (root mean square roughness) is preferably not more than 0.15 nm, more preferably not more than 0.1 nm. In the invention, the surface roughness RMS may be a value measured, for example, in the range of 1 µm-square by an atomic force microscope AFM.

On the other hand, another main surface which is the opposite side to the one main surface on which a multilayer reflection film is formed is usually a surface to be sucked when the reflective mask is set on an exposure tool. Thus, another main surface of the substrate is also preferably flat, and the flatness is preferably not more than 1 µm to obtain sufficient pattern position accuracy.

In the reflective mask, the multilayer reflection film is a film for reflecting exposure light such as EUV light. As the multilayer reflection film, an alternately laminated layers consisting of a plurality of kinds of layers having different optical properties, for example, two kinds of layers consisting of a layer A and a layer B laminated alternately and having different optical properties each other are used. Particularly, a plurality of kinds of layers having different refractive indexes, for example, a high refractive index and a low refractive index are laminated periodically. For EUV light, silicon (Si) is used as a material having the high refraction index, molybdenum (Mo) is uses as a material having the low refraction index, and an Si/Mo laminated film in which silicon (Si) layers and molybdenum (Mo) layers are alternately laminated is exemplified as the multilayer reflection film. The plurality of kinds of layers are laminated, for example, at least 2 cycles (at least 2 layers, respectively), preferably at least 40 cycles (at least 40 layers, respectively), and not more than 60 cycles (not more than 60 layers, respectively). When the cycles are too few, reflectance may be low, and when the cycles are too many, the film may become thick and have large film stress. In case of the Si/Mo laminated film, the silicon (Si) layer and the molybdenum (Mo) layer preferably consist of, respectively, silicon only and molybdenum only. However, the silicon layer and the molybdenum layer may be composed of a silicon compound and a molybdenum compound, respectively.

In case of the Si/Mo laminated film, the layer closet to the substrate may be either the Si layer or the Mo layer. The layer remotest from the substrate may be either the Si layer or the Mo layer, however, the remotest layer is preferably the Si layer. A thicknesses of a high refraction index layer and a low refraction index layer in the multilayer reflection film is set to suitable thicknesses in accordance with an exposure wavelength. For example, in case of EUV light (an exposure wavelength of 13 to 14 nm), a thickness of the high refraction index layer and the low refraction index layer per one cycle is preferably adjusted to 6 to 8 nm, and a thickness of the high refraction index layer is preferably adjusted to 10 to 90% of the total thickness of the one cycle. In addition, each thickness of the high refraction index layers and the low refraction index layers may be constant or individually different. A thickness of the whole of the multilayer reflection film is normally about 240 to 320 nm.

Although it depends on the composition and layer configuration of the multilayer reflection film, for example, a multilayer reflection film has a reflectance with respect to extreme ultraviolet (EUV) light at an incident angle of 6° of preferably at least 60%, more preferably at least 65%.

As a method for forming a multilayer reflection film, a sputtering method in which power is supplied to a target and an ambient gas is turned into plasma (ionization) by the supplied power to perform sputtering, and an ion beam sputtering method in which an ion beam is irradiated to a target are exemplified. As a sputtering method, a DC sputtering method in which a DC voltage is applied to a target, and an RF sputtering method in which a high frequency voltage is applied to a target.

The sputtering method is a film forming method that utilizes sputtering phenomenon of gas ions by applying a voltage to a target with feeding a gas such as Ar gas into a chamber to ionize the gas. Particularly, a magnetron sputtering method has an advantage in productivity. The magnetron sputtering method is a sputtering method in which a magnet is placed to the back side of a target thereby a plasma density of the target is increased at the vicinity above the target by a magnetic field. The magnetron sputtering is preferably applied for the film forming since plasma is maintained even if a gas pressure (sputtering pressure) at the time of discharge is low, and a film forming rate is high. The power may be applied to the target by a DC system or an RF system. The DC system also includes a pulse sputtering that inverts a negative bias applied to the target for a short time in order to prevent charge-up of the target.

The forming of the multilayer reflection film by the sputtering method may be performed, for example, by using a sputtering equipment capable of attaching a plurality of targets. Specifically, the multilayer reflection film may be formed by using a metal or metalloid target (for example, Si target) constituting the layer A, a metal or metalloid target (for example, Mo target) constituting the layer B, and a rare gas such as Ar gas and Kr gas, as a sputtering gas, facing the target and the main surface of the substrate each other, and then sputtering the metal or metalloid target constituting the layer A and the metal or metalloid target constituting the layer B alternately to form the layer A and the layer B alternately. Sputtering is preferably carried out while rotating the substrate along the main surface.

In case of the Si/Mo laminated film, when the silicon (Si) layer and the molybdenum (Mo) layer are composed of a silicon compound and a molybdenum compound, respectively, the film can be formed by a reactive sputtering in which a reactive gas such as an oxygen-containing gas, a nitrogen-containing gas, a carbon-containing gas, and other gases is used, as a sputtering gas, along with a rare gas. Further, the target may be composed of a silicon compound or a molybdenum compound.

The absorber film formed on the multilayer film is a film that absorbs exposure light and reduces reflectance of the exposure light. A transfer pattern in a reflective mask is formed by a difference of reflectance between a portion on which the absorber film is formed and a portion on which the absorber film is not formed. The absorber film of the invention may be a single layer or a plurality of layers. In case of single layer, the single layer is configurated by a first layer, and in case of the plurality of layers, the plurality of layers is configurated by, from the substrate side, a first layer and a second layer. The first layer is composed of tantalum and nitrogen. The first layer contains at least 55 at %, and not more than 70 at %, preferably not more than 65 at % of tantalum, and at least 30 at %, preferably at least 35 at %, and not more than 45 at % of nitrogen. When the nitrogen content of the first layer is more than 45 at %, in other words, tantalum content of the first layer is less than 55 at %, film stress significantly increases. Further, a difference between maximum and minimum contents (at %) of tantalum in the first layer is preferably not more than 10.

On the other hand, the second layer may be a surface oxidized layer formed by natural oxidation. The second layer is composed of tantalum, nitrogen and oxygen. The second layer contains oxygen of not more than 40 at %, preferably not more than 30 at %, more preferably not more than 28 at %. The second layer has a thickness of preferably not more than 5 nm, more preferably not more than 3 nm, most preferably not more than 2 nm. In this case, the remainder other than oxygen content corresponds to the total content of tantalum and nitrogen. The tantalum content is preferably at least 55 at %, and preferably not more than 70 at %, more preferably not more than 65 at %, and the nitrogen content is preferably at least 30 at %, more preferably at least 35 at %, and preferably not more than 45 at %, with respect to the total content of tantalum and nitrogen. According to the first layer having the above tantalum content and nitrogen content, particularly the first and second layers having the above tantalum content and nitrogen content, film stress of the absorber film is reduced and etching rate is increased. Even when the second layer (surface oxidized layer) is present, since the etching rate does not decrease, the cross-sectional shape is less likely to deteriorate.

By forming the absorber film in this way, it can be ensured etching selectivity of the absorber film to a film formed below the absorber film such as a multilayer reflection film and a protective film, further a hard mask film that can be formed above the absorber film. Further, the absorber film has an uniform etching rate in the thickness direction thereby obtaining good pattern shape by dry etching. As the dry etching which is applied to this case is normally dry etching using a fluorine-based gas. Particularly, dry etching using a fluorine-based gas substantively not containing oxygen is preferable. Examples of the fluorine-based gas include $CF_4$, $SF_6$ and other gases. When the nitrogen content of the first layer is less than 30 at %, etching rate may be reduced and etching selectivity of the absorber film to a film formed above or below the absorber film may be deteriorated. In addition, the oxygen content of the surface oxidized layer formed by natural oxidation tends to be high.

In the invention, the absorber film preferably has an amorphous or crystal (preferably microcrystal) structure at the middle portion in a thickness direction. A crystallinity at the substrate side is preferably different from that at the middle portion, more preferably higher than that at the middle portion. Further, a crystallinity at the side remote from the substrate is preferably different from that at the middle portion, more preferably higher than that at the middle portion.

Specifically, the crystal structure and crystallinity can be observed as an electron diffraction image that is obtained by indenting an electron beam to a cross-section of the absorber film. It can be evaluated by confirming difference in tendency of crystal grains at each position in the thickness direction of the absorber film in the cross-section of the absorber film by the electron diffraction image.

In case that the absorber film is a single layer, the first layer may be constructed by three sub-layers. In this case, the sub-layer disposed at the middle portion in a thickness direction of the first layer preferably has an amorphous or crystal (preferably microcrystal) structure. A crystal structure of the sub-layer at the substrate side of the first layer is preferably different from that of the sub-layer at the middle portion in the thickness direction of the first layer, more preferably, a crystallinity of the sub-layer at the substrate side of the first layer is higher than that of the sub-layer at the middle portion in the thickness direction of the first layer. Further, a crystal structure of the sub-layer at the side remote from the substrate of the first layer is preferably different from that of the sub-layer at the middle portion in the thickness direction of the first layer, more preferably, a crystallinity of the sub-layer at the side remote from the substrate of the first layer is higher than that of the sub-layer at the middle portion in the thickness direction of the first layer.

In case that the absorber film is a plurality of layers, the first layer may be constructed by two or three sub-layers. In case that the first layer is constructed by two sub-layers, the sub-layer disposed at the side remote from the substrate of the first layer preferably has an amorphous or crystal (preferably microcrystal) structure. A crystal structure of the sub-layer at the substrate side of the first layer is preferably different from that of the sub-layer at the side remote from the substrate of the first layer, more preferably, a crystallinity of the sub-layer at the substrate side of the first layer is higher than that of the sub-layer at the side remote from the substrate of the first layer. Further, a crystal structure of the second layer is preferably different from that of the sub-layer at the side remote from the substrate of the first layer, more preferably, a crystallinity of the second layer is higher than that of the sub-layer at the side remote from the substrate of the first layer.

On the other hand, in case that the absorber film is a plurality of layers, and the first layer is constructed by three sub-layers, the sub-layer disposed at the middle portion in a thickness direction of the first layer preferably has an amorphous or crystal (preferably microcrystal) structure. A crystal structure of the sub-layer at the substrate side of the first layer is preferably different from that of the sub-layer at the middle portion in the thickness direction of the first layer, more preferably, a crystallinity of the sub-layer at the substrate side of the first layer is higher than that of the sub-layer at the middle portion in the thickness direction of the first layer. Further, crystal structures of the sub-layer at the side remote from the substrate of the first layer and the second layer are preferably different from that of the sub-layer at the middle portion in the thickness direction of the first layer, more preferably, crystallinities of the sub-layer at the side remote from the substrate of the first layer and the second layer are higher than that of the sub-layer at the middle portion in the thickness direction of the first layer.

By making the crystal structure (crystallinity) of the absorber film at the substrate side or the side remote from the substrate that is different from crystal structure (crystallinity) at the middle portion in the thickness direction of the absorber film, formation of a surface oxidized layer due to natural oxidation at the side remote from the substrate (particularly outermost surface portion) is controlled in the absorber film having such a structure.

The absorber film has a thickness of preferably at least 30 nm, more preferably at least 40 nm, and preferably not more than 100 nm, more preferably not more than 80 nm. The absorber film has a surface roughness RMS of preferably not more than 0.6 nm, more preferably not more than 0.5 nm. The absorber film, particularly the middle portion in the thickness direction of the absorber film is preferably free of β-Ta crystal phase, α-Ta crystal phase and cubical TaN crystal phase. In the absorber film containing these crystal phases, the film stress may increase or the surface roughness may increase. The film stress and the surface roughness can be reduced by the absorber film not containing these crystal phases. Further, in the absorber film containing these crystal phases, the shape of the edge portion of the pattern may be roughened, and sensitivity for detecting foreign material may decrease in defect inspection. On the other hand, the side remote from the substrate of the absorber film may contain cubical TaN crystal phase since the formation of the surface oxidized layer can be controlled when the side remote from the substrate of the absorber film contains cubical TaN crystal phase and has high crystallinity. The β-Ta crystal phase, α-Ta crystal phase and cubic TaN crystal phase can be detected by X-ray diffraction (XRD). The state which is substantively free of β-Ta crystal phase, α-Ta crystal phase and cubical TaN crystal phase corresponds to a state in which the peaks identified as these crystal phases are not detected.

When the substrate is a 6025 substrate which has a main surface of 152 mm-square, a variation ΔTIR of warpages within the central area of the surface of 142 mm-square, as a difference before and after forming the absorber film on a multilayer reflection film or the protection film, is preferably not more than 0.4 μm, more preferably not more than 0.3 μm, as an absolute value. A reflective mask having a small amount of change in warpage is a reflective mask blank that has an absorber film with small deviation in the pattern position when the absorber film is patterned to manufacture the reflective mask. Further, when the absorber film has a small amount of variation ΔTIR of warpages in a condition just after forming the absorber film, it is possible to further reduce the amount of ΔTIR of warpages by subsequent treatment (for example, heat treatment).

Herein, the central area of the substrate surface within 142 mm-square is set as a range 5 mm inside from the peripheral edge of the surface (one main surface) of the 152 mm square substrate on which the absorber film is formed. This range is a region in which a photomask pattern used for exposure using the reflective mask is formed in the reflective mask. As the warpage of the substrate before the absorber film is formed (specifically, after the multilayer reflection film or the multilayer reflection film and the protective film are formed), and the warpage of the substrate after the absorber film is formed, a flatness defined by TIR (Total Indicator Reading) obtained in measuring surface shape by a flatness measuring apparatus is applied. A ΔTIR, as an amount of change in TIR, is defined as a difference between maximum value or minimum value of the amount of change at each coordinate in the substrate plane between when a film is present and when the film is absent on the same substrate where the height of the center of the substrate when the surface shape of the substrate is measured is set as the origin in the height direction. The warpage and the amount of change of warpage can be measured and calculated by a commercially available measuring apparatus such as a flatness tester (for example, Tropel Ultra Flat 200 Mask, manufactured by Corning Incorporated).

The absorber film may have phase shift function. When the absorber film does not assume phase shift function, a reflectance of the absorber film is preferably not more than 10%, more preferably not more than 5%, most preferably not more than 2% with respect to exposure light, particularly EUV light. On the other hand, when the absorber film has phase shift function, the absorber film may have a reflectance with respect to exposure light higher than the reflectance of the absorber film that does not assume phase shift function. In this case, a reflectance of the absorber film is preferably not more than 50%, more preferably not more than 30% with respect to exposure light, particularly EUV light, and as same in the case of the absorber film that does not assume phase shift function, the reflectance of the absorber film is preferably not more than 10%, more preferably not more than 5%. A phase shift amount (difference of phase) of the absorber film having phase shift function is a difference of phase between reflected light from a portion on which the absorber film is formed and reflected light from a portion on which the absorber film is not formed. The phase shift amount is preferably at least 150°, more preferably at least 170°, and preferably not more than 210°, more preferably not more than 190°, and most preferably about 180°. Resolution can be increased by using phase shift effect.

A reflectance reducing film having a function of reducing reflectance with respect to the inspection light used in inspection of the absorber film may be formed at the side remote from the substrate of the absorber film. The inspection sensitivity of pattern inspection can be increased by this configuration. Further, a layer for enhancing irradiation resistibility to exposure light may be formed as an outermost surface layer disposed at the side remote from the substrate in the absorber film.

The absorber film can be formed by a sputtering method, and the sputtering method is preferably a magnetron sputtering method. Specifically, the absorber film is formed by preferably a reactive sputtering method using a Ta target substantively not containing impurity, feeding, as a sputtering gas, a rare gas such as Ar gas and Kr gas, and nitrogen gas ($N_2$) as a reactive gas to a sputtering chamber, and sputtering the target. A pressure inside the sputtering chamber (sputtering pressure) is preferably at least 0.15 Pa, and preferably less than 0.4 Pa, more preferably not more than 0.3 Pa. Even if compositions of the absorber film to be formed are same, it is possible to form an absorber film having a different surface roughness and a crystal structure (crystallinity) by changing the sputtering pressure. If the sputtering pressure is high, it is hard to form a film having high crystallinity. However, if the pressure is too high, not only the surface roughness becomes large, but also oxygen from atmosphere or the like tends to easily diffuse to the film.

In the sputtering, for example, before forming the first layer of the absorber film consisting of a single layer or the absorber film consisting of a plurality of layers, a sputtering (pre-sputtering) may be performed in advance under a condition in which a ratio (vol %) of nitrogen gas in the sputter gas is higher than the ratio of subsequent sputtering for the absorber film, followed by forming the first layer of the absorber film consisting of a single layer or the absorber film consisting of a plurality of layers. By this method, in the first layer of the absorber film consisting of a single layer or the absorber film consisting of a plurality of layers, the crystallinity of the portion formed just after the start of forming the film, i.e., the substrate side of the absorber film can be controlled such that the portion has high crystallinity in compared with that of the middle portion in the thickness direction of the absorber film. Further, for example, the crystallinity of the portion formed just before the end of forming the absorber film, i.e., the side remote from the substrate of the absorber film can be controlled by varying an electric power applied to the target and/or a flow rate of the sputter gas, thereby the portion having high crystallinity in compared with that of the middle portion in the thickness direction of the absorber film can be formed. In the absorber film consisting of a plurality of layers, the outermost surface portion at the side remote from the substrate of the absorber film formed by sputtering may be a second layer of the surface oxidized layer formed by natural oxidation. Also in this case, the crystallinity of the portion formed just before the end of forming the absorber film, i.e., the side remote from the substrate of the absorber film can be controlled by varying an electric power applied to the target and/or a flow rate of the sputter gas, thereby the portion having high crystallinity in compared with that of the middle portion in the thickness direction of the absorber film can be formed. After that, the second layer can be formed as the surface oxidized layer by natural oxidation. In particular, in case of a magnetron sputtering, the crystal structure (crystallinity) and flatness of the absorber film can be controlled by adjusting an amount of feeding and/or exhausting sputtering gas to change the pressure inside the chamber (sputtering pressure).

Examples of the material of the protection film include a material containing ruthenium (Ru). Particularly, examples of the material containing ruthenium (Ru) include ruthenium (Ru) (simple substance), and a ruthenium alloy containing ruthenium (Ru), and a metal such as titanium (Ti), niobium (Nb), molybdenum (Mo) and zirconium (Zr). The ruthenium alloy preferably contains at least 50% and less than 100% of ruthenium. A thickness of the protection film is preferably at least 1 nm, and preferably not more than 10 nm, more preferably not more than 5 nm. The protection film can be formed by, for example, an ion beam sputtering method or a magnetron sputtering method.

A sheet resistance of the conductive film is preferably not more than 100Ω/□, and a material and a film thickness of the conductive film are not particularly limited. Examples of the material of the conductive film include, for example, a material containing chromium (Cr) or tantalum (Ta). The material containing chromium (Cr) or tantalum (Ta) may contain oxygen (O), nitrogen (N), carbon (C), boron (B), and other elements. Particularly, examples of the material containing chromium include, for example, Cr (simple substance), and a chromium compound such as CrO, CrN, CrON, CrC, CrCN, CrCO, CrCON, CrB, CrOB, CrNB, CrONB, CrCB, CrCNB, CrCOB and CrCONB. Examples of the material containing tantalum include, for example, Ta (simple substance), and a tantalum compound such as TaO, TaN, TaON, TaC, TaCN, TaCO, TaCON, TaB, TaOB, TaNB, TaONB, TaCB, TaCNB, TaCOB and TaCONB.

A thickness of the conductive film is not particularly limited as long as the conductive film functions for an electrostatic chuck use. The thickness is normally about 5 to 50 nm. The thickness of the conductive film is preferably formed so that a film stress is balanced with the multilayer reflection film and the absorber pattern after a reflective mask is obtained, that is, after the absorber pattern is formed. The conductive film may be formed before forming the multilayer reflection film, or after forming all of the films disposed at the side of the multilayer reflection film on the substrate. Further, the conductive film may be formed after forming a part of the films disposed at the side of the multilayer reflection film on the substrate, then the remainder of the films disposed at the side of the multilayer reflection film on the substrate. The conductive film can be formed by, for example, a magnetron sputtering method.

A hard mask film which has different etching property from the absorber film and functions as an etching mask in etching when the absorber film is patterned may be provided on the absorber film. After the absorber pattern is formed, the hard mask film may be left as the reflectance reducing film for a part of the absorber film or removed to be absent on the reflective mask. Examples of the material of the hard mask film include a material containing chromium (Cr). When the above-mentioned reflectance reducing film is formed on the absorber film, the hard mask film may be formed on the reflectance reducing film. The hard mask film can be formed by, for example, a magnetron sputtering method. A thickness of the hard mask is normally about 5 to 20 nm, however, not limited thereto.

Further, the reflective mask blank may include a resist film such as a photoresist film formed on the side remotest from the substrate used for patterning the absorber film, the hard mask and other films. The photoresist film is preferably an electron beam (EB) resist.

EXAMPLES

Examples of the invention are given below by way of illustration and not by way of limitation.

Experimental Example 1

A TaN-series film which corresponds to an absorber film of a reflective mask blank was formed on one main surface of a quartz glass substrate having sizes of 152 mm square and 6.35 mm thick by a DC pulse magnetron sputtering while the substrate was rotated. First, before forming the film on the substrate, a pre-sputtering was performed by applying a power of 1,000 W to a Ta target with feeding Ar gas (30 vol %) and $N_2$ gas (70 vol %) into a chamber under 0.07 Pa of inner pressure of the chamber. Next, the quartz glass substrate was set into the chamber, and the TaN-series film having a thickness of 40 nm was formed on the substrate by applying a power of 1,000 W to the Ta target with feeding Ar gas (33 vol %) and $N_2$ gas (67 vol %) into the chamber under 0.16 Pa of inner pressure of the chamber.

After taking out the obtained TaN-series film into the atmosphere at room temperature, the composition of the TaN-series film was measured by an X-ray photoelectron spectroscopy (XPS) apparatus (K-Alpha, manufactured by Thermo Fisher Scientific Inc.). Ta and N contents were 57 at % and 43 at %, respectively, with respect to the total of Ta and N. On the other hand, a surface oxidized layer due to natural oxidation was formed by exposing to air, and had an oxygen content of 25 at % with respect to the total of Ta, N and O, and a thickness of not more than 2 nm.

A surface roughness RMS of the obtained TaN-series film was measured by an atomic force microscope (AFM) apparatus (NANO-IM-8, manufactured by Pacific Nanotechnology Inc.), and was 0.54 nm. A cross section of the obtained TaN-series film including a part of the substrate and the whole of the TaN-series film and having a thickness of 70 nm was cut out by a focused ion beam (FIB) apparatus (HeliosG4CX, manufactured by FEI Company). Next, an electron beam whose diameter was narrowed to about 5 nm was irradiated to the cross-section of an upper portion in the thickness direction (the side remote from the substrate), a middle portion, and a lower portion in the thickness direction (the substrate side), and the crystal structure (crystallinity) was evaluated by an electron diffraction (ED). As a result, it was confirmed that the crystallinity of the lower portion was higher than that of the middle portion. Electron diffraction images are shown in FIG. 4A. In FIG. 4A, upper, middle and lower electron diffraction images were observed at the upper, middle and lower portions of the film, respectively. Further, diffraction peaks of the obtained TaN-series film were measured by X-ray diffraction (XRD) apparatus (SmartLab, manufactured by Rigaku Co., Ltd.), and confirmed crystal phases contained in the obtained TaN-series film. Any of β-Ta crystal phase, α-Ta crystal phase and cubical TaN crystal phase was not detected.

Further, the obtained TaN-series film was dry-etched under the following conditions by an inductively coupled plasma (ICP) etching apparatus (Unixis G4, manufactured by Plasma-Therm), and an etching rate was measured. The etching rate was 0.64 nm/sec on average for the whole thickness of the film.

<Dry Etching Conditions>
Pressure: 5 mTorr (0.67 Pa)
Temperature: 25° C.
RF1 (bias): applied power=54 W, frequency=13.56 MHz
RF2 (source): applied power=325 W, frequency=13.56 MHz
$SF_6$ gas flow rate: 5 sccm
He gas flow rate: 150 sccm
End point detection: Detected by Optical Emission Spectroscopy of nitrogen Next, a multilayer reflection film having a thickness of 284 nm in which, from the substrate side, Si layers having a thickness of 4 nm and Mo layers having a thickness of 3 nm were alternately laminated 40 layers in each, and a Si layer having a thickness of 4 nm was further laminated was formed on the main surface of a quartz glass substrate having sizes of 152 mm-square and 6.35 mm-thick. Further, a protective film composed of Ru and having a thickness of 2 nm was formed thereon. Consequently, a substrate on which the multilayer reflection film and the protective film were formed was prepared. Using the substrate on which the multilayer reflection film and the protective film were formed, a TaN-series film having a thickness of 70 nm was formed as an absorber film on the protective film by the same film formation method of the absorber film described above with extending the time for film formation. Before and after forming the absorber film, the warpages (TIR) in the 142 mm square at the center of the substrate surface were measured by a flatness tester (Tropel Ultra Flat 200 Mask, manufactured by Corning Incorporated), and an amount of change (ΔTIR) of warpages before and after the film forming was calculated. The ΔTIR was 0.35 μm as an absolute value.

Experimental Example 2

A TaN-series film which corresponds to an absorber film of a reflective mask blank was formed on one main surface of a quartz glass substrate having sizes of 152 mm square and 6.35 mm thick by a DC pulse magnetron sputtering while the substrate was rotated. First, before forming the film on the substrate, a pre-sputtering was performed by applying a power of 1,000 W to a Ta target with feeding Ar gas (33 vol %) and $N_2$ gas (67 vol %) into a chamber under 0.14 Pa of inner pressure of the chamber. Next, the quartz glass substrate was set into the chamber, and the TaN-series film having a thickness of 40 nm was formed on the substrate by applying a power of 1,000 W to the Ta target with feeding Ar gas (41 vol %) and $N_2$ gas (59 vol %) into the chamber under 0.24 Pa of inner pressure of the chamber.

After taking out the obtained TaN-series film into the atmosphere at room temperature, the composition of the TaN-series film was measured by the same method in Experimental Example 1. Ta and N contents were 58 at % and 42 at %, respectively, with respect to the total of Ta and N. On the other hand, a surface oxidized layer due to natural oxidation was formed by exposing to air, and had an oxygen content of 22 at % with respect to the total of Ta, N and O, and a thickness of not more than 2 nm.

A surface roughness RMS of the obtained TaN-series film was measured by the same method in Experimental Example 1, and was 0.54 nm. A crystal structure (crystallinity) of a cross section of the obtained TaN-series film was evaluated by the same method in Experimental Example 1. As a result, it was confirmed that the crystallinity of the lower portion was higher than that of the middle portion. Electron diffraction images are shown in FIG. 4B. In FIG. 4B, upper, middle and lower electron diffraction images were observed at the upper, middle and lower portions of the film, respectively. Further, crystal phases contained in the obtained TaN-series film were confirmed by the same method in Experimental Example 1. Any of β-Ta crystal phase, α-Ta crystal phase and cubical TaN crystal phase was not detected.

Further, an etching rate of the obtained TaN-series film was measured by the same method in Experimental Example 1. The etching rate was 0.68 nm/sec on average for the whole thickness of the film.

Next, a substrate on which the multilayer reflection film and the protective film were formed, as same in Experimental Example 1, was prepared. Using the substrate on which the multilayer reflection film and the protective film were formed, a TaN-series film having a thickness of 70 nm was formed as an absorber film on the protective film by the same film formation method of the absorber film described above with extending the time for film formation. Before and after forming the absorber film, the warpages (TIR) were measured, and an amount of change (ΔTIR) of warpages before and after the film forming was calculated. The ΔTIR was 0.27 μm as an absolute value.

Experimental Example 3

A TaN-series film which corresponds to an absorber film of a reflective mask blank was formed on one main surface of a quartz glass substrate having sizes of 152 mm square and 6.35 mm thick by a DC pulse magnetron sputtering while the substrate was rotated. First, before forming the film on the substrate, a pre-sputtering was performed by applying a power of 1,000 W to a Ta target with feeding Ar gas (67 vol %) and $N_2$ gas (33 vol %) into a chamber under 0.07 Pa of inner pressure of the chamber. Next, the quartz glass substrate was set into the chamber, and the TaN-series film having a thickness of 40 nm was formed on the substrate by applying a power of 1,000 W to the Ta target with feeding Ar gas (30 vol %) and $N_2$ gas (70 vol %) into the chamber under 0.08 Pa of inner pressure of the chamber.

After taking out the obtained TaN-series film into the atmosphere at room temperature, the composition of the TaN-series film was measured by the same method in Experimental Example 1. Ta and N contents were 60 at % and 40 at %, respectively, with respect to the total of Ta and N. On the other hand, a surface oxidized layer due to natural oxidation was formed by exposing to air, and had an oxygen content of 23 at % with respect to the total of Ta, N and O, and a thickness of not more than 2 nm.

A surface roughness RMS of the obtained TaN-series film was measured by the same method in Experimental Example 1, and was 0.73 nm. A crystal structure (crystallinity) of a cross section of the obtained TaN-series film was evaluated by the same method in Experimental Example 1. As a result, it was confirmed that the crystallinity of the middle portion was higher than those of the upper and lower portions. Electron diffraction images are shown in FIG. 4C. In FIG. 4C, upper, middle and lower electron diffraction images were observed the upper, middle and lower portions of the film, respectively. Further, crystal phases contained in the obtained TaN-series film were confirmed by the same method in Experimental Example 1. Any of β-Ta crystal phase, α-Ta crystal phase and cubical TaN crystal phase was not detected. In this example in which the pressure inside the chamber was low (less than 0.15 Pa), regardless of the same film composition in Experimental Example 1, it was confirmed that the crystallinity tends to increase in the middle portion of the absorber film in the thickness direction and to increase the surface roughness.

Further, an etching rate of the obtained TaN-series film was measured by the same method in Experimental Example 1. The etching rate was 0.63 nm/sec on average for the whole thickness of the film.

Next, a substrate on which the multilayer reflection film and the protective film were formed, as same in Experimental Example 1, was prepared. Using the substrate on which the multilayer reflection film and the protective film were formed, a TaN-series film having a thickness of 70 nm was formed as an absorber film on the protective film by the same film formation method of the absorber film described above with extending the time for film formation. Before and after forming the absorber film, the warpages (TIR) were measured, and an amount of change (ΔTIR) of warpages before and after the film forming was calculated. The ΔTIR was 0.40 μm as an absolute value.

Experimental Example 4

A TaN-series film which corresponds to an absorber film of a reflective mask blank was formed on one main surface of a quartz glass substrate having sizes of 152 mm square and 6.35 mm thick by a DC pulse magnetron sputtering while the substrate was rotated. First, before forming the film on the substrate, a pre-sputtering was performed by applying a power of 1,000 W to a Ta target with feeding Ar gas (67 vol %) and $N_2$ gas (33 vol %) into a chamber under 0.49 Pa of inner pressure of the chamber. Next, the quartz glass substrate was set into the chamber, and the TaN-series film having a thickness of 40 nm was formed on the substrate by applying a power of 1,000 W to the Ta target with feeding Ar gas (67 vol %) and $N_2$ gas (33 vol %) into the chamber under 0.49 Pa of inner pressure of the chamber.

After taking out the obtained TaN-series film into the atmosphere at room temperature, the composition of the TaN-series film was measured by the same method in Experimental Example 1. Ta and N contents were 61 at % and 39 at %, respectively, with respect to the total of Ta and N. On the other hand, a surface oxidized layer due to natural oxidation was formed by exposing to air, and had an oxygen content of 30 at % with respect to the total of Ta, N and O. An about 6 at % of oxygen was detected at the position of about 30 nm from the surface of the film. Particularly, oxidation had been proceeded with a higher oxygen content from the surface of the film to about 3 nm-thick.

A surface roughness RMS of the obtained TaN-series film was measured by the same method in Experimental Example 1, and was 0.76 nm. A crystal structure (crystallinity) of a cross section of the obtained TaN-series film was evaluated by the same method in Experimental Example 1. As a result, it was confirmed that the crystallinities of the upper, middle and lower portions were equivalent. Electron diffraction images are shown in FIG. 4D. In FIG. 4D, upper, middle and lower electron diffraction images were observed at the upper, middle and lower portions of the film, respectively. Further, crystal phases contained in the obtained TaN-series film were confirmed by the same method in Experimental Example 1. Any of β-Ta crystal phase, α-Ta crystal phase and cubical TaN crystal phase was not detected. In this example in which the pre-sputtering conditions were the same as the sputtering conditions for the subsequent film formation and the pressure inside the chamber was high (0.4 Pa or more), there was no tendency such as shown in Experimental Example 3 for increase of the crystallinity at the middle portion in the thickness direction, and the film structure had the equivalent crystallinity in the upper, middle and lower portions. However, it was confirmed that the surface roughness tends to increase and the surface oxidized layer tends to thicken.

Further, an etching rate of the obtained TaN-series film was measured by the same method in Experimental Example 1. The etching rate was 0.48 nm/sec on average for the whole thickness of the film.

Next, a substrate on which the multilayer reflection film and the protective film were formed, as same in Experimental Example 1, was prepared. Using the substrate on which the multilayer reflection film and the protective film were formed, a TaN-series film having a thickness of 70 nm was formed as an absorber film on the protective film by the same film formation method of the absorber film described above with extending the time for film formation. Before and after forming the absorber film, the warpages (TIR) were measured, and an amount of change (ΔTIR) of warpages before and after the film forming was calculated. The ΔTIR was 0.04 μm as an absolute value.

Experimental Example 5

A TaN-series film which corresponds to an absorber film of a reflective mask blank was formed on one main surface of a quartz glass substrate having sizes of 152 mm square and 6.35 mm thick by a DC pulse magnetron sputtering while the substrate was rotated. First, before forming the film on the substrate, a pre-sputtering was performed by applying a power of 1,000 W to a Ta target with feeding Ar gas (86 vol %) and $N_2$ gas (14 vol %) into a chamber under 0.06 Pa of inner pressure of the chamber. Next, the quartz glass substrate was set into the chamber, and the TaN-series film having a thickness of 40 nm was formed on the substrate by applying a power of 1,000 W to the Ta target with feeding Ar gas (86 vol %) and $N_2$ gas (14 vol %) into the chamber under 0.06 Pa of inner pressure of the chamber.

After taking out the obtained TaN-series film into the atmosphere at room temperature, the composition of the TaN-series film was measured by the same method in Experimental Example 1. Ta and N contents were 89 at % and 11 at %, respectively, with respect to the total of Ta and N. On the other hand, a surface oxidized layer due to natural oxidation was formed by exposing to air, and had an oxygen content of 44 at % with respect to the total of Ta, N and O, and a thickness of about 3 nm.

Crystal phases contained in the obtained TaN-series film were confirmed by the same method in Experimental Example 1. Any of β-Ta crystal phase and cubical TaN crystal phase was not detected, however, α-Ta crystal phase was detected.

Further, an etching rate of the obtained TaN-series film was measured by the same method in Experimental Example 1. The etching rate was 0.26 nm/sec on average for the whole thickness of the film.

Next, a substrate on which the multilayer reflection film and the protective film were formed, as same in Experimental Example 1, was prepared. Using the substrate on which the multilayer reflection film and the protective film were formed, a TaN-series film having a thickness of 70 nm was formed as an absorber film on the protective film by the same film formation method of the absorber film described above with extending the time for film formation. Before and after forming the absorber film, the warpages (TIR) were measured, and an amount of change (ΔTIR) of warpages before and after the film forming was calculated. The ΔTIR was 0.80 μm as an absolute value.

Experimental Example 6

A TaN-series film which corresponds to an absorber film of a reflective mask blank was formed on one main surface of a quartz glass substrate having sizes of 152 mm square and 6.35 mm thick by a DC pulse magnetron sputtering while the substrate was rotated. First, before forming the film on the substrate, a pre-sputtering was performed by applying a power of 1,000 W to a Ta target with feeding $N_2$ gas (100 vol %) only into a chamber under 0.15 Pa of inner pressure of the chamber. Next, the quartz glass substrate was set into the chamber, and the TaN-series film having a thickness of 40 nm was formed on the substrate by applying a power of 1,000 W to the Ta target with feeding $N_2$ gas (100 vol %) only into the chamber under 0.09 Pa of inner pressure of the chamber.

After taking out the obtained TaN-series film into the atmosphere at room temperature, the composition of the TaN-series film was measured by the same method in Experimental Example 1. Ta and N contents were 53 at % and 47 at %, respectively, with respect to the total of Ta and N. On the other hand, a surface oxidized layer due to natural oxidation was formed by exposing to air, and had an oxygen content of 19 at % with respect to the total of Ta, N and O, and a thickness of about not more than 2 nm.

A surface roughness RMS of the obtained TaN-series film was measured by the same method in Experimental Example 1, and was 1.11 nm. Further, crystal phases contained in the obtained TaN-series film were confirmed by the same method in Experimental Example 1. Any of β-Ta crystal phase and α-Ta crystal phase was not detected, however, cubical TaN crystal phase was detected.

Next, a substrate on which the multilayer reflection film and the protective film were formed, as same in Experimental Example 1, was prepared. Using the substrate on which the multilayer reflection film and the protective film were formed, a TaN-series film having a thickness of 70 mm was formed as an absorber film on the protective film by the same film formation method of the absorber film described above with extending the time for film formation. Before and after forming the absorber film, the warpages (TIR) were measured, and an amount of change (ΔTIR) of warpages before and after the film forming was calculated. The ΔTIR was 1.0 μm as an absolute value.

Japanese Patent Application No. 2020-70677 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A reflective mask blank that is a material for a reflective mask used in EUV lithography using EUV light as the exposure light, comprising a substrate, a multilayer reflection film that is formed on one main surface of the substrate and reflects the exposure light, and an absorber film that is formed on the multilayer reflection film and absorbs the exposure light, wherein
   the absorber film is a single layer consisting of a first layer, or a plurality of layers consisting of, from the substrate side, a first layer and a second layer,
   the first layer is composed of tantalum and nitrogen,
   the second layer is composed of tantalum and nitrogen, and oxygen of not more than 40 at %,
   the first layer contains 55 to 70 at % of tantalum and 30 to 45 at % of nitrogen,
   the absorber film consists of, in a thickness direction, a substrate-side portion, a middle portion, and a portion remote from the substrate, and
   the absorber film has an amorphous or crystal structure at the middle portion, and crystallinity at each of the substrate-side portion and the portion remote from the substrate is higher than crystallinity at the middle portion.

2. The reflective mask blank of claim 1 wherein the absorber film has a surface roughness RMS of not more than 0.6 nm.

3. The reflective mask blank of claim 1 wherein the absorber film is free of β-Ta crystal phase, α-Ta crystal phase and cubical TaN crystal phase.

4. The reflective mask blank of claim 1 comprising a protection film wherein the protection film is intervened between the multilayer reflection film and the absorber film, is contact with the multilayer reflection film, and has different etching property from the absorber film.

5. The reflective mask blank of claim 1 further comprising a conductive film formed on another main surface of the substrate.

6. The reflective mask blank of claim 1 wherein said one main surface has a size of 152 mm-square, and a variation DTIR of warpages TIRs within the central area of the surface of 142 mm-square before and after forming the absorber film is not more than 0.4 mm as an absolute value.

7. A method of manufacturing a reflective mask blank of claim 1, comprising a step of forming the absorber film by a reactive sputtering in which magnetron sputtering using a Ta target and a sputtering gas is applied, the sputtering gas being a rare gas, and nitrogen gas $N_2$ as a reactive gas.

8. A reflective mask manufactured from the reflective mask blank of claim 1.

9. The reflective mask blank of claim 1 wherein the absorber film is disposed contiguously on the multilayer reflection film.

10. The reflective mask blank of claim 1 comprising a protection film wherein the protection film is intervened between the multilayer reflection film and the absorber film, is contact with both of the multilayer reflection film and the absorber film, and has different etching property from the absorber film.

* * * * *